United States Patent
Mullick et al.

(10) Patent No.: US 10,699,953 B2
(45) Date of Patent: Jun. 30, 2020

(54) METHOD FOR CREATING A FULLY SELF-ALIGNED VIA

(71) Applicant: Micromaterials LLC, Wilmington, DE (US)

(72) Inventors: Amrita B. Mullick, Santa Clara, CA (US); Nitin K. Ingle, Santa Clara, CA (US); Xikun Wang, Sunnyvale, CA (US); Regina Freed, Los Altos, CA (US); Uday Mitra, Cupertino, CA (US); Ho-yung David Hwang, Cupertino, CA (US)

(73) Assignee: Micromaterials LLC, Wilmington, DE (US)

(*) Notice: Subject to any disclaimer, the term of this patent is extended or adjusted under 35 U.S.C. 154(b) by 0 days.

(21) Appl. No.: 16/425,020

(22) Filed: May 29, 2019

(65) Prior Publication Data
US 2019/0378756 A1    Dec. 12, 2019

Related U.S. Application Data

(60) Provisional application No. 62/682,238, filed on Jun. 8, 2018.

(51) Int. Cl.
*H01L 21/768* (2006.01)
*H01L 23/522* (2006.01)
*H01L 21/311* (2006.01)
*H01L 23/532* (2006.01)

(52) U.S. Cl.
CPC .. *H01L 21/76897* (2013.01); *H01L 21/31111* (2013.01); *H01L 21/76831* (2013.01); *H01L 21/76873* (2013.01); *H01L 23/5226* (2013.01); *H01L 23/53238* (2013.01)

(58) Field of Classification Search
CPC ......... H01L 21/76897; H01L 21/02118; H01L 21/31133; H01L 23/5226; H01L 23/528
See application file for complete search history.

(56) References Cited

U.S. PATENT DOCUMENTS

| 4,671,970 | A  | 6/1987  | Keiser et al. |
| 5,824,597 | A  | 10/1998 | Hong |
| 6,130,151 | A  | 10/2000 | Lin et al. |
| 6,143,653 | A  | 11/2000 | Tsai et al. |
| 6,528,884 | B1 | 3/2003  | Lopatin et al. |
| 6,576,113 | B1 | 6/2003  | Scherer et al. |
| 6,653,200 | B2 | 11/2003 | Olsen |

(Continued)

FOREIGN PATENT DOCUMENTS

| JP | 2008108757 A | 5/2008 |
| JP | 2011060803 A | 3/2011 |

(Continued)

OTHER PUBLICATIONS

PCT International Search Report and Written Opinion in PCT/US2017/037141 dated Aug. 31, 2017, 11 pages.

(Continued)

*Primary Examiner* — Elias Ullah
(74) *Attorney, Agent, or Firm* — Servilla Whitney LLC (57) ABSTRACT

Apparatuses and methods to provide a fully self-aligned via are described. Some embodiments of the disclosure provide an electronic device having a liner that is selectively removable when compared to conductive lines. The liner may be selectively removed by utilizing one or more of a base (e.g. sodium hydroxide) and hydrogen peroxide.

20 Claims, 5 Drawing Sheets

(56) References Cited

U.S. PATENT DOCUMENTS

| | | |
|---|---|---|
| 7,192,803 B1 | 3/2007 | Lin et al. |
| 7,279,119 B2 | 10/2007 | Hellring et al. |
| 7,288,463 B1 | 10/2007 | Papasouliotis |
| 7,541,297 B2 | 6/2009 | Mallick et al. |
| 7,985,977 B2 | 7/2011 | Gogoi et al. |
| 8,034,705 B2 | 10/2011 | Choi et al. |
| 8,338,225 B2 | 12/2012 | Breitwisch et al. |
| 8,575,753 B2 | 11/2013 | Choi et al. |
| 8,951,429 B1 | 2/2015 | Liu et al. |
| 9,012,322 B2 | 4/2015 | Duong et al. |
| 9,117,884 B1 | 8/2015 | Shaviv et al. |
| 9,236,292 B2 | 1/2016 | Romero et al. |
| 9,312,220 B2 | 4/2016 | Lu et al. |
| 9,324,650 B2 | 4/2016 | Edelstein et al. |
| 9,362,165 B1 | 6/2016 | Bouche et al. |
| 9,362,413 B2 | 6/2016 | Yu et al. |
| 9,368,395 B1 | 6/2016 | Wei et al. |
| 9,490,202 B2 | 11/2016 | Lin et al. |
| 9,666,451 B2 | 5/2017 | Wallace et al. |
| 9,679,781 B2 | 6/2017 | Abatchez et al. |
| 9,721,888 B2 | 8/2017 | Chang et al. |
| 9,837,314 B2 | 12/2017 | Smith et al. |
| 10,083,834 B2 | 9/2018 | Thompson et al. |
| 10,319,604 B2 | 6/2019 | Duan et al. |
| 10,319,636 B2 | 6/2019 | Basu et al. |
| 2002/0098642 A1 | 7/2002 | Harris et al. |
| 2002/0163081 A1 | 11/2002 | Aoyama |
| 2003/0143862 A1 | 7/2003 | Iyer |
| 2004/0067649 A1 | 4/2004 | Hellring et al. |
| 2004/0192034 A1 | 9/2004 | Ohiwa et al. |
| 2005/0121768 A1 | 6/2005 | Edelstein et al. |
| 2005/0167846 A1 | 8/2005 | Aoyama |
| 2005/0266627 A1 | 12/2005 | Furukawa et al. |
| 2006/0169576 A1 | 8/2006 | Brown et al. |
| 2006/0286806 A1 | 12/2006 | Ohkuni et al. |
| 2007/0166981 A1 | 7/2007 | Furukawa et al. |
| 2007/0199922 A1 | 8/2007 | Shen et al. |
| 2008/0160783 A1 | 7/2008 | Watanabe et al. |
| 2008/0182411 A1 | 7/2008 | Elers |
| 2008/0242097 A1 | 10/2008 | Boescke et al. |
| 2009/0017631 A1 | 1/2009 | Bencher |
| 2009/0072409 A1 | 3/2009 | Nitta et al. |
| 2009/0174040 A1 | 7/2009 | Gogoi et al. |
| 2009/0269569 A1 | 10/2009 | Fucsko et al. |
| 2010/0078617 A1 | 4/2010 | Breitwisch et al. |
| 2010/0096691 A1 | 4/2010 | Shin et al. |
| 2010/0171220 A1 | 7/2010 | Cheng-Lin |
| 2010/0173494 A1 | 7/2010 | Kobrin |
| 2010/0203725 A1 | 8/2010 | Choi et al. |
| 2010/0301480 A1 | 12/2010 | Choi et al. |
| 2010/0330805 A1 | 12/2010 | Doan et al. |
| 2011/0049568 A1 | 3/2011 | Lochtefeld et al. |
| 2011/0057317 A1 | 3/2011 | Koike et al. |
| 2011/0089393 A1 | 4/2011 | Kuo-Pin et al. |
| 2011/0207318 A1 | 8/2011 | Usami |
| 2011/0281417 A1 | 11/2011 | Gordon et al. |
| 2012/0115302 A1 | 5/2012 | Breitwisch et al. |
| 2012/0156857 A1 | 6/2012 | Cohen |
| 2012/0178235 A1 | 7/2012 | Pachamuthu et al. |
| 2013/0072019 A1 | 3/2013 | Ryan |
| 2013/0109148 A1 | 5/2013 | Oh et al. |
| 2013/0241037 A1 | 9/2013 | Jeong et al. |
| 2013/0264533 A1 | 10/2013 | Cheong et al. |
| 2014/0029181 A1 | 1/2014 | Gstrein |
| 2014/0264747 A1 | 9/2014 | Barabash |
| 2014/0264896 A1 | 9/2014 | Wei et al. |
| 2014/0327140 A1 | 11/2014 | Zhang et al. |
| 2015/0111374 A1 | 4/2015 | Bao et al. |
| 2015/0132901 A1 | 5/2015 | Wang et al. |
| 2015/0137113 A1 | 5/2015 | Yu et al. |
| 2015/0170956 A1 | 6/2015 | Naik et al. |
| 2015/0279736 A1 | 10/2015 | Hotta et al. |
| 2015/0287675 A1 | 10/2015 | Shaviv |
| 2015/0325622 A1 | 11/2015 | Zhang et al. |
| 2015/0357439 A1 | 12/2015 | Liu et al. |
| 2015/0364420 A1 | 12/2015 | Mei et al. |
| 2015/0371896 A1 | 12/2015 | Chen et al. |
| 2016/0049427 A1 | 2/2016 | Zang |
| 2016/0056074 A1 | 2/2016 | Na |
| 2016/0056104 A1 | 2/2016 | Bouche et al. |
| 2016/0068710 A1 | 3/2016 | Wang et al. |
| 2016/0093635 A1 | 3/2016 | Rabkin et al. |
| 2016/0111342 A1 | 4/2016 | Huang et al. |
| 2016/0141416 A1 | 5/2016 | Mariani et al. |
| 2016/0163587 A1 | 6/2016 | Backes et al. |
| 2016/0163640 A1 | 6/2016 | Edelstein et al. |
| 2016/0190008 A1 | 6/2016 | Chandrashekar et al. |
| 2016/0190009 A1 | 6/2016 | Wallace et al. |
| 2016/0260779 A1 | 9/2016 | Kawashima et al. |
| 2017/0076945 A1 | 3/2017 | Hudson |
| 2017/0077037 A1 | 3/2017 | Kelly et al. |
| 2017/0186849 A1 | 6/2017 | Chen et al. |
| 2017/0263563 A1 | 9/2017 | Dutta et al. |
| 2017/0338149 A1 | 11/2017 | Lin |
| 2018/0096847 A1 | 4/2018 | Thompson et al. |
| 2018/0130657 A1 | 5/2018 | Duan et al. |
| 2018/0130671 A1 | 5/2018 | Duan et al. |
| 2018/0144980 A1 | 5/2018 | Basu et al. |
| 2018/0358260 A1 | 12/2018 | Roy et al. |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.

PCT International Search Report and Written Opinion in PCT/US2017/059737 dated May 18, 2018, 11 pages.

PCT International Search Report and Written Opinion in PCT/US2017/060367 dated Feb. 22, 2018, 9 pages.

PCT International Search Report and Written Opinion in PCT/US2017/060368 dated Jan. 31, 2018, 11 pages.

PCT International Search Report and Written Opinion in PCT/US2018/019146 dated May 23, 2018, 12 pages.

PCT International Search Report and Written Opinion in PCT/US2018/027284 dated Aug. 2, 2018, 10 pages.

PCT International Search Report and Written Opinion in PCT/US2018/036690 dated Sep. 18, 2018, 9 pages.

PCT International Search Report and Written Opinion in PCT/US2018/048503 dated Dec. 14, 2018, 10 pages.

PCT International Search Report and Written Opinion in PCT/US2018/048504 dated Dec. 13, 2018, 10 pages.

PCT International Search Report and Written Opinion in PCT/US2018/048509 dated Dec. 13, 2018, 10 pages.

PCT ISR & Written Opinion for PCT/US2018/026026, dated Jul. 26, 2018, 11 pages.

PCT International Search Report and Written Opinion in PCT/US2019/034353 dated Sep. 19, 2019, 9 pages.

METHOD FOR CREATING A FULLY SELF-ALIGNED VIA

CROSS-REFERENCE TO RELATED APPLICATIONS

This application claims priority to U.S. Provisional Application No. 62/682,238, filed Jun. 8, 2018, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of vias or contacts which skip a layer.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide the full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield, and increases manufacturing cost. Additionally, the conventional methods using a liner do not provide for methods of selectively removed the liner relative to the metal. Thus, there is a need for new methods of removing a liner.

SUMMARY

Apparatuses and methods to provide a fully self-aligned via are described. In one embodiment, a method of forming a self-aligned via is described. A substrate is provided having a first insulating layer thereon. The first insulating layer having a top surface and a plurality of trenches formed along a first direction. The plurality of trenches have recessed conductive lines extending along the first direction and have a first conductive surface below the top surface of the first insulating layer. A liner comprising tantalum is formed on the recessed first conductive lines. At least one pillar is formed on the recessed first conductive lines. The at least one pillar extends orthogonal to the top surface of the first insulating layer. A second insulating layer is deposited around the first pillars and on the top surface of the first insulating layer. At least one of the pillars is removed to form at least one opening in the second insulating layer, leaving at least one pillar on the recessed first conductive lines. The liner is removed from the recessed first conductive lines using one or more of a base and hydrogen peroxide.

One or more embodiments are directed to methods to provide a fully self-aligned via. A substrate is provided having a first insulating layer thereon. The first insulating layer has a top surface and a plurality of trenches formed along a first direction. The plurality of trenches have recessed first conductive lines extending along the first direction and have a first conductive surface below the top surface of the first insulating layer. The first insulating layer comprises ultra low-k and the recessed first conductive lines comprise copper or cobalt. A liner comprising tantalum is formed on the recessed first conductive lines. A metal film comprising tungsten is formed on the recessed first conductive lines. At least one pillar comprising tungsten oxide is grown from the metal film on the recessed first conductive lines. The at least one pillar extends orthogonal to the top surface of the first insulating layer. A second insulating layer is deposited on the first insulating layer, around the at least one pillar and on a top of the at least one pillar to form an overburden of the second insulating layer. The second insulating layer is planarized to remove the overburden of the second insulating layer and expose the top of the at least one pillar. At least one of the pillars is selectively removed to form at least one opening in the second insulating layer, leaving at least one pillar on the recessed first conductive lines. The liner is removed from the recessed first conductive lines using a base and hydrogen peroxide in a ratio of about 1:1 to about 5:1. The base is selected from one or more of sodium hydroxide, potassium hydroxide, aluminum hydroxide, lithium hydroxide, rubidium hydroxide, cesium hydroxide, pyridine, ammonium hydroxide, trimethylamine (TMA), trimethylamine (TEA), or tetramethylammonium hydroxide (TMAH). A third insulating layer is deposited through the at least one opening onto the recessed conductive lines. The third insulating is etched selectively relative to the second insulating layer to form at least one via opening to the first conductive lines. A second conductive material is deposited in the at least one opening to form a via and second conductive lines. The first via connects the recessed first conductive lines to the second conductive lines.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Apparatuses and methods to provide a fully self-aligned via are described. In one embodiment, a method of forming a self-aligned via is described. A substrate is provided having a first insulating layer thereon. The first insulating layer having a top surface and a plurality of trenches formed along a first direction. The plurality of trenches have recessed conductive lines extending along the first direction and have a first conductive surface below the top surface of the first insulating layer. A liner comprising tantalum is formed on the recessed first conductive lines. At least one pillar is formed on the recessed first conductive lines. The at least one pillar extends orthogonal to the top surface of the first insulating layer. A second insulating layer is deposited around the first pillars and on the top surface of the first insulating layer. At least one of the pillars is removed to form at least one opening in the second insulating layer, leaving at least one pillar on the recessed first conductive lines. The liner is removed from the recessed first conductive lines using one or more of a base and hydrogen peroxide.

In one or more embodiment, depositing the second insulating layer comprises depositing a second insulating material on the first insulating layer, around and on a top of the at least one pillar to form an overburden of the second insulating layer; and planarizing the second insulating layer to remove the overburden of the second insulating layer and expose the top of the at least one pillar.

In one embodiment, the bridging via is self-aligned along the first direction to one of the second conductive lines.

In one embodiment, a fully self-aligned via is the via that is self-aligned along at least two directions to the conductive lines in a lower and an upper metallization layer. In one embodiment, the fully self-aligned via is defined by a hard mask in one direction and the underlying insulating layer in another direction, as described in further detail below.

Comparing to the conventional techniques, some embodiments advantageously provide fully self-aligned vias that cause no damage to the dielectric material(s) and does not need a high aspect ratio dielectric etch. In some embodiments, the fully self-aligned vias provide lower via resistance and capacitance benefits over the conventional vias. Some embodiments of the self-aligned vias provide full alignment between the vias and the conductive lines of the metallization layers that is substantially error free that advantageously increase the device yield and reduce the device cost.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Figure 1A:
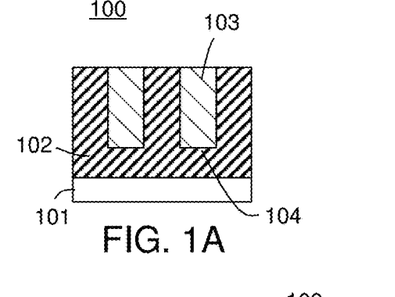
FIG. 1A illustrates a cross-sectional view of an electronic device structure to provide a fully self-aligned via according to one embodiment.
Figure 1B:
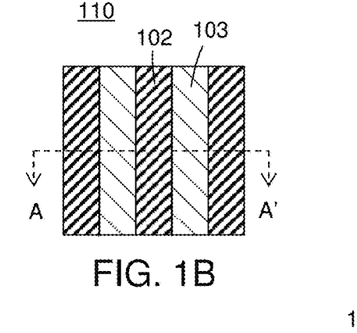
FIG. 1B illustrates a top view of the electronic device structure depicted in FIG. 1A.
Figure 1C:
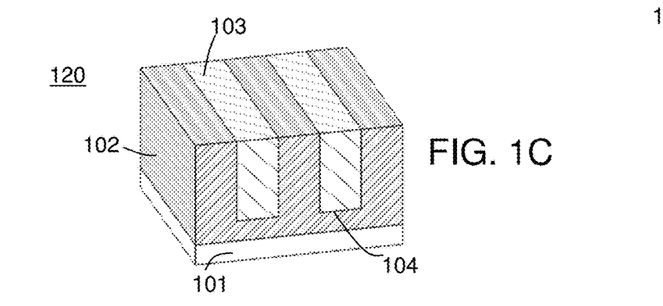
FIG. 1C illustrates a perspective view of the electronic device structure depicted in FIG. 1A.

FIG. 1A illustrates a cross-sectional view 100 of an electronic device structure to provide a fully self-aligned via according to one embodiment. FIG. 1B is a top view 110 of the electronic device depicted in FIG. 1A, and FIG. 1C is a perspective view 120 of the electronic device depicted in FIG. 1A. A lower metallization layer (Mx) comprises a set of conductive lines 103 that extend along an X axis (direction) 121 on an insulating layer 102 on a substrate 101. The X axis of FIGS. 1A-1C extends orthogonally to the plane of the Figure page. As shown in FIGS. 1A-1C, X axis (direction) 121 crosses Y axis (direction) 122 at an angle 123. In one embodiment, angle 123 is about 90 degrees. In another embodiment, angle 123 is an angle that is other than the 90 degrees angle. The insulating layer 102 comprises trenches 104. The conductive lines 103 are deposited in trenches 104.

In an embodiment, the substrate 101 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, e.g., an organic, a ceramic, a glass, or a semiconductor substrate. Although a few examples of materials from which the substrate 101 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate 101 includes one or more layers above substrate 101 to confine lattice dislocations and defects.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD). In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one embodiment, insulating layer 102 includes a dielectric material having a k-value less than 5. In one embodiment, insulating layer 102 includes a dielectric material having a k-value less than 2. In at least some embodiments, insulating layer 102 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, insulating layer 102 may include polyimide, epoxy, photodefinable materials, such as benzocyclobutene (BCB), and WPR-series materials, or spin-on-glass.

In one embodiment, insulating layer 102 is a low-k interlayer dielectric to isolate one metal line from other metal lines on substrate 101. In one embodiment, the thickness of the insulating layer 102 is in an approximate range from about 10 nanometers (nm) to about 2 microns (μm).

In an embodiment, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, the lower metallization layer Mx comprising conductive lines 103 (i.e., metal lines) is a part of a back end metallization of the electronic device. In one embodiment, the insulating layer 102 is patterned and etched using a hard mask to form trenches 104 using one or more patterning and etching techniques known to one of ordinary skill in the art of microelectronic device manufacturing. In one embodiment, the size of trenches 104 in the insulating layer 102 is determined by the size of conductive lines formed later on in a process.

In one embodiment, forming the conductive lines 103 involves filling the trenches 104 with a layer of conductive material. In one embodiment, a base layer (not shown) is first deposited on the internal sidewalls and bottom of the trenches 104, and then the conductive layer is deposited on the base layer. In one embodiment, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the insulating layer 102. Additionally, the conductive barrier layer can be used to provide adhesion for the seed layer (e.g., copper).

In one embodiment, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base layer of copper, by an electroplating process. In one embodiment, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one embodiment, the choice of a material for conductive layer for the conductive lines 103 determines the choice of a material for the seed layer. For example, if the material for the conductive lines 103 includes copper, the material for the seed layer also includes copper. In one embodiment, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In one embodiment, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing. Chemical mechanical polishing (CMP) is a sacrificial-resist etch-back process, which can rapidly remove a layer of film using a buffing wheel in connection with an abrasive slurry and a chemical etchant.

In one non-limiting example, the thickness (as measured along the z-axis of FIGS. 1A-1C) of the conductive lines 103 is in an approximate range from about 15 nm to about 1000 nm. In one non-limiting example, the thickness of the conductive lines 103 is from about 20 nm to about 200 nm. In one non-limiting example, the width (as measured along the y-axis of FIGS. 1A-1C) of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In an embodiment, the lower metallization layer Mx is configured to connect to other metallization layers (not shown). In an embodiment, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

In one or more embodiments, the conductive lines 103 comprise one or more of copper or cobalt. In one or more embodiments, the conductive lines 103 comprise copper. In one or more embodiment, the conductive lines 103 comprise cobalt.

Figure 2A:
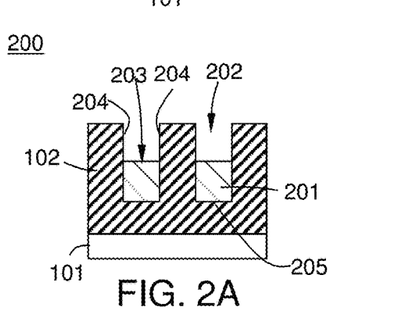
FIG. 2A is a view similar to FIG. 1A, after the conductive lines are recessed according to one embodiment.
Figure 2B:
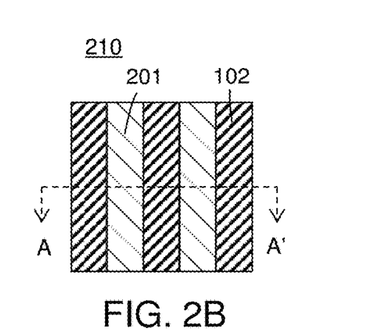
FIG. 2B illustrates a top view of the electronic device structure depicted in FIG. 2A.
Figure 2C:
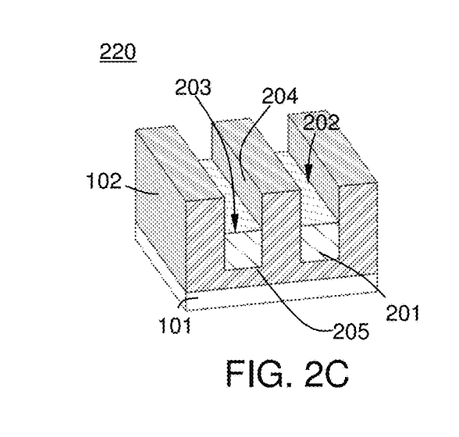
FIG. 2C illustrates a perspective view of the electronic device structure depicted in FIG. 2A.

FIG. 2A is a view 200 similar to cross-sectional view 100 of FIG. 1A, after the conductive lines 103 are recessed according to one embodiment. FIG. 2B is a top view 210 of the electronic device depicted in FIG. 2A, and FIG. 2C is a perspective view 220 of the electronic device depicted in FIG. 2A. The conductive lines 103 are recessed to a predetermined depth to form recessed conductive lines 201. As shown in FIGS. 2A-2C, trenches 205 are formed in the insulating layer 102. Each trench 205 has sidewalls 204 that are portions of insulating layer 102 and a bottom that is a top surface 203 of the recessed conductive lines 201.

In one embodiment, the depth of the trenches 205 is from about 10 nm to about 500 nm. In one embodiment, the depth of the trenches 205 is from about 10% to about 100% of the thickness of the recessed conductive lines 201. In one embodiment, the conductive lines 103 are recessed using one or more of wet etching, dry etching, or a combination thereof techniques known to one of ordinary skill in the art of electronic device manufacturing.

Figure 3A:
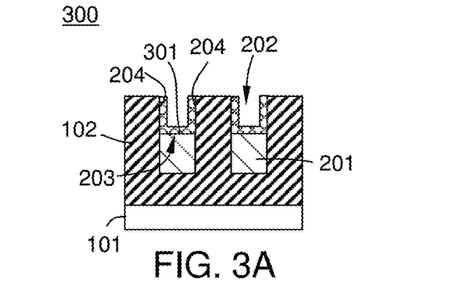
FIG. 3A illustrates a view similar to FIG. 2A, after a liner has been deposited on recessed conductive lines according to one embodiment.
Figure 3B:
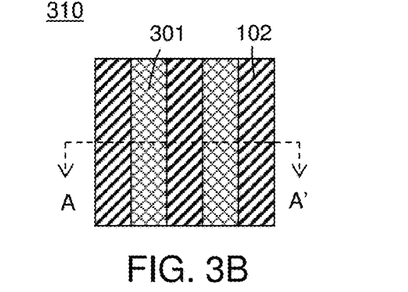
FIG. 3B illustrates a top view of the electronic device structure depicted in FIG. 3A.
Figure 3C:
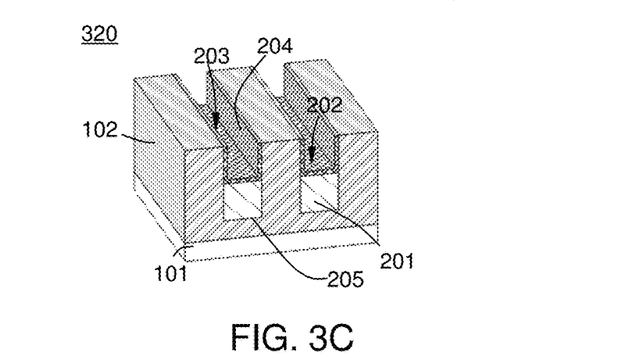
FIG. 3C illustrates a perspective view of the electronic device structure depicted in FIG. 3A.

FIG. 3A is a view 300 similar to FIG. 2A, after a liner 301 is deposited on the recessed conductive lines 201 according to one embodiment. In some embodiments, the liner 301 is deposited on the sidewalls 204 of the trenches 205 and on the top surface 203 of the recessed conductive lines 201.

In one embodiment, liner 301 is deposited to protect the recessed conductive lines 201 from changing properties later on in a process (e.g., during tungsten deposition, or other processes). In one embodiment, liner 301 is a conductive liner. In another embodiment, liner 301 is a non-conductive liner. In one embodiment, liner 301 includes titanium nitride (TiN), titanium (Ti), tantalum (Ta), tantalum nitride (TaN), or any combination thereof. In one or more embodiment, the liner may further comprise one or more of ruthenium (Ru) or cobalt (Co). Tantalum nitride (TaN) is a copper barrier at film thicknesses greater than 10 Å, where the film is continuous. While tantalum nitride (TaN) can be conductive, TaN may be useful as a dielectric liner material when incorporated in sufficiently small amounts. In an embodiment, the liner 301 is deposited to the thickness from about 0.5 nm to about 10 nm.

In an embodiment, the liner 301 is deposited using an atomic layer deposition (ALD) technique. In one embodiment, the liner 301 is deposited using one of deposition techniques, such as but not limited to a CVD, PVD, MBE, MOCVD, spin-on, or other liner deposition techniques know to one of ordinary skill in the art of microelectronic device manufacturing. In one embodiment, the liner 301 may be selectively removed using one or more of the dry and wet etching techniques described herein.

Figure 4A:
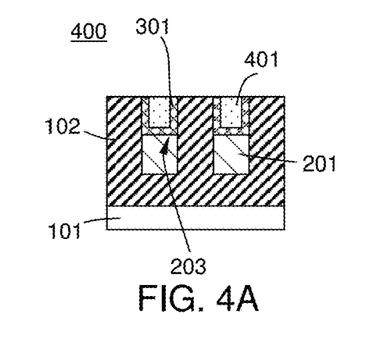
FIG. 4A is a view similar to FIG. 3A after a metal film has been deposited on the liner according to one embodiment.
Figure 4B:
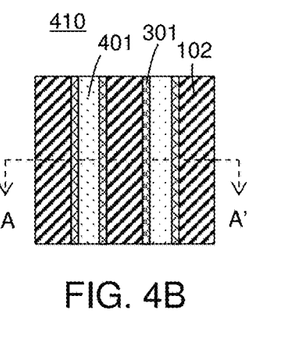
FIG. 4B illustrates a top view of the electronic device structure depicted in FIG. 4A.
Figure 4C:
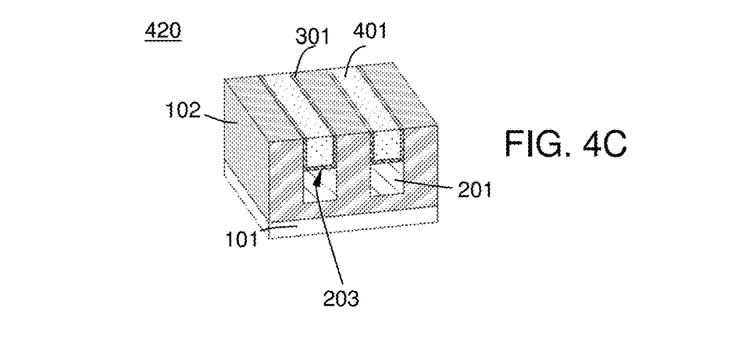
FIG. 4C illustrates a perspective view of the electronic device structure depicted in FIG. 4A.

FIG. 4A is a view 400 similar to FIG. 3A, after a gapfill layer 401 is deposited on the liner 301 on the recessed conductive lines 201. FIG. 4B is a top view 410 of the electronic device depicted in FIG. 4A, and FIG. 4C is a perspective view 420 of the electronic device depicted in FIG. 4A. As shown in FIGS. 4A-4C, gapfill layer 401 is deposited on the liner 301. In one embodiment, gapfill layer 401 is a tungsten (W) layer, or other gapfill layer to provide selective growth pillars. In some embodiments, gapfill layer 401 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, seed gapfill layer 401 comprises is a tungsten (W) seed gapfill layer.

In one embodiment, the gapfill layer 401 is deposited using one of deposition techniques, such as but not limited to an ALD, a CVD, PVD, MBE, MOCVD, spin-on or other liner deposition techniques known to one of ordinary skill in the art of microelectronic device manufacturing.

In some embodiments, deposition of the gapfill layer 401 includes formation of a seed gapfill layer (not shown). As will be understood by the skilled artisan, a seed gapfill layer is a relatively thin layer of material that can increase the nucleation rate (i.e., growth rate) of the gapfill layer 401. In some embodiments, the seed gapfill layer is the same material as the gapfill layer 401 deposited by a different technique. In some embodiments, the seed gapfill layer is a different material than the gapfill layer 401.

The formation of the gapfill layer 401 may be described as using a bulk deposition of the gapfill material to form an overburden (not illustrate) on the top of the substrate followed by planarization to remove the overburden. In some embodiments, the gapfill layer 401 is formed by a selective deposition process that forms substantially no (e.g., <5% area) overburden on the insulating layer 102.

Portions of the seed gapfill layer 401 may then be removed to expose top portions of the insulating layer 102 according to one embodiment, and as illustrated in FIGS. 4A-4C. In one embodiment, the portions of the seed gapfill layer 401 are removed using one of the chemical-mechanical planarization (CMP) techniques known to one of ordinary skill in the art of microelectronic device manufacturing.

Figure 5A:
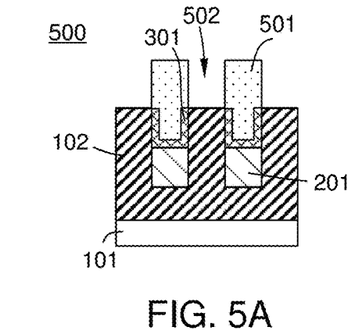
FIG. 5A is a view similar to FIG. 4A after a pillars have been grown on the liner according to one embodiment.
Figure 5B:
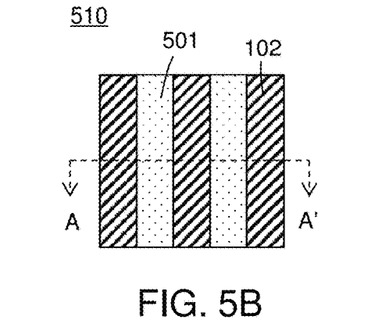
FIG. 5B illustrates a top view of the electronic device structure depicted in FIG. 5A.
Figure 5C:
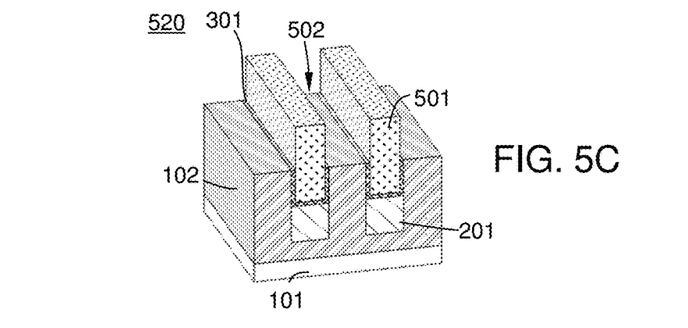
FIG. 5C illustrates a perspective view of the electronic device structure depicted in FIG. 5A.

FIG. 5A is a view 500 similar to FIG. 4A, after self-aligned selective growth pillars 501 are formed using the seed gapfill layer 401 according to one embodiment. FIG. 5B is a top view 510 of the electronic device depicted in FIG. 5A, and FIG. 5C is a perspective view 520 of the electronic device depicted in FIG. 5A. As shown in FIGS. 5A-5C, an array of the self-aligned selective growth pillars 501 has the same pattern as the set of the recessed conductive lines 201. As shown in FIGS. 5A-5C, the pillars 501 extend substantially orthogonally from the top surfaces of the liner 301 on the recessed conductive lines 201. As shown in FIGS. 5A-5C, the pillars 501 extend along the same direction as the recessed conductive lines 201. As shown in FIGS. 5A-5C, the pillars are separated by gaps 502.

Referring to FIGS. 5A-5C, in one embodiment, the pillars 501 are selectively grown from the gapfill layer 401 on the liner 301 on the recessed conductive lines 201. In one embodiment, portions of the gapfill layer 401 above the liner 301 are expanded for example, by oxidation, nitridation, or other process to grow pillars 501. In one or more embodiment, the gapfill layer 401 is a metal film, and the metal film is used to grow at least one pillar 501 by one or more of oxidation, nitridation, or other process. In one embodiment, the gapfill layer 401 is oxidized by exposure to an oxidizing agent or oxidizing conditions to transform the metal or metal containing gapfill layer 401 to metal oxide pillars 501. In one embodiment, pillars 501 include an oxide of one or more metals listed above. In more specific embodiment, pillars 501 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $N_2$/Ar, $N_2$/He, $N_2$/Ar/He, ammonium persulphate, organic peroxide agents, such as meta-chloroperbenzoic acid and peracids (e.g. trifluoroperacetic acid, 2,4-dinitroperbenzoic acid, peracetic acid, persulfuric acid, percarbonic acid, perboric acid, and the like), or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one embodiment, the pillars 501 are formed by oxidation of the seed gapfill layer at any suitable temperature depending on, for example, the composition of the seed gapfill layer and the oxidizing agent. In some embodiments, the oxidation occurs at a temperature in an approximate range of about 25° C. to about 800° C. In some embodiments, the oxidation occurs at a temperature greater than or equal to about 150° C.

In one embodiment, the height of the pillars 501 is in an approximate range from about 5 angstroms (Å) to about 10 microns (μm).

Figure 6A:
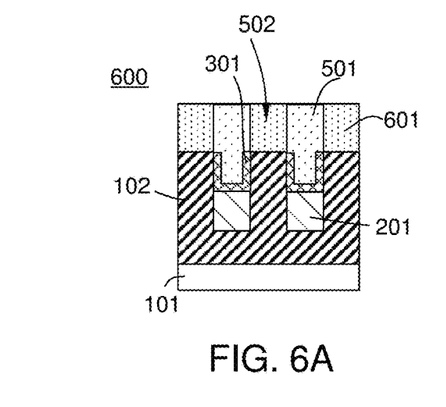
FIG. 6A is a view similar to FIG. 5A after an insulating layer has been deposited according to one embodiment.
Figure 6B:
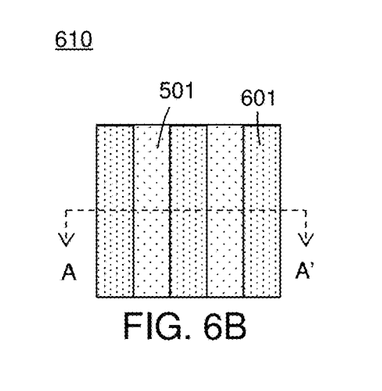
FIG. 6B illustrates a top view of the electronic device structure depicted in FIG. 6A.
Figure 6C:
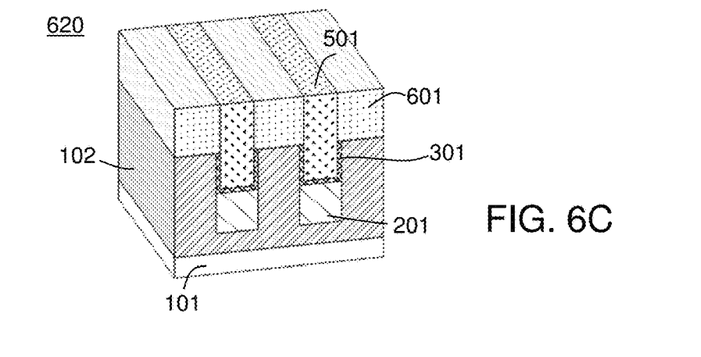
FIG. 6C illustrates a perspective view of the electronic device structure depicted in FIG. 6A.

FIG. 6A is a view 600 similar to FIG. 5A, and, after an insulating layer 601 is deposited to overfill the gaps 502 between the pillars 5401 according to one embodiment. FIG. 6B is a top view 610 of the electronic device depicted in FIG. 6A, and FIG. 6C is a perspective view 620 of the electronic device depicted in FIG. 6A. As shown in FIGS. 6A-6C, insulating layer 601 is deposited on and around the pillars 501 and through the gaps 502 on the portions of the insulating layer 102 between the pillars 501.

In one embodiment, insulating layer 601 is a low-k gapfill layer. In one embodiment, insulating layer 601 is a flowable silicon oxide (FSiOx) layer. In at least some embodiments, insulating layer 601 is an oxide layer, e.g., silicon dioxide ($SiO_2$), or any other electrically insulating layer determined by an electronic device design. In one embodiment, insulating layer 601 is an interlayer dielectric (ILD). In one embodiment, insulating layer 601 is a low-k dielectric that includes, but is not limited to, materials such as, e.g., silicon dioxide, silicon oxide, a carbon based material, e.g., a porous carbon film, carbon doped oxide ("CDO"), e.g. carbon doped silicon dioxide, porous silicon dioxide, porous silicon oxide carbide hydride (SiOCH), silicon nitride, or any combination thereof. In one embodiment, insulating layer 601 is a dielectric material having k-value less than 3. In more specific embodiment, insulating layer 601 is a dielectric material having k-value in an approximate range from about 2.2 to about 2.7. In one embodiment, insulating layer 601 includes a dielectric material having k-value less than 2. In one embodiment, insulating layer 601 represents one of the insulating layers described above with respect to insulating layer 102.

In one embodiment, insulating layer 601 is a low-k interlayer dielectric to isolate one metal line from other metal lines. In one embodiment, insulating layer 601 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

Figure 7A:
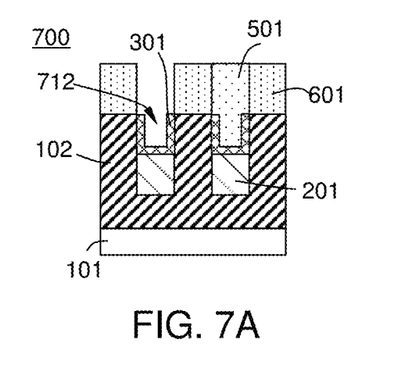
FIG. 7A is a view similar to FIG. 6A after at least one pillar has been removed according to one embodiment.
Figure 7B:
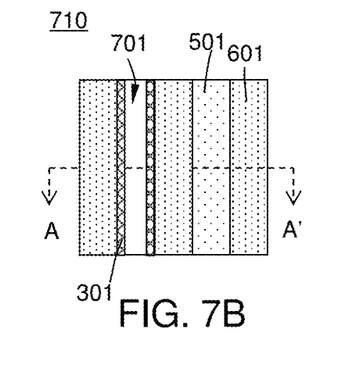
FIG. 7B illustrates a top view of the electronic device structure depicted in FIG. 7A.

FIG. 7A is a view 700 similar to FIG. 6A after at least one self-aligned selectively grown pillars 501 is selectively removed to form opening 701 according to one embodiment. FIG. 7B is a top view 710 of the electronic device depicted in FIG. 7A. As shown in FIGS. 7A-7B, the pillars 501 are removed selectively to the insulating layer 601, insulating layer 102, and recessed conductive lines 201. In another embodiment, when liner 301 is a conductive liner, liner 301 remains in place, and at least one pillar 501 is removed selectively to the insulating layer 601, insulating layer 102, and liner 301. As shown in FIGS. 7A-7B, opening 701 is formed in the insulating layers 601 and 102. Opening 701 extends along the same axis as the recessed conductive lines 201. As shown in FIGS. 7A-7B, each opening 701 has a bottom that is a top surface 203 of recessed conductive lines 201. The bottom of the opening 701 is the top surface of liner 301. Generally, the aspect ratio of the trench refers to the ratio of the depth of the trench to the width of the opening. In one embodiment, the aspect ratio of each opening 701 is in an approximate range from about 1:1 to about 200:1.

In one embodiment, the pillars 501 are selectively removed using one or more of the dry and wet etching techniques known to one of ordinary skill in the art of electronic device manufacturing. In one embodiment, the pillars 501 are selectively wet etched by e.g., 5 wt. % of ammonium hydroxide ($NH_4OH$) aqueous solution at the temperature of about 80° C. In one embodiment, hydrogen peroxide ($H_2O_2$) is added to the 5 wt. % $NH_4OH$ aqueous solution to increase the etching rate of the pillars 501. In one embodiment, the pillars 501 are selectively wet etched using hydrofluoric acid (HF) and nitric acid ($HNO_3$) in a ratio of 1:1. In one embodiment, the pillars 501 are selectively wet etched using HF and $HNO_3$ in a ratio of 3:7 respectively. In one embodiment, the pillars 501 are selectively wet etched using HF and $HNO_3$ in a ratio of 4:1, respectively. In one embodiment, the pillars 501 are selectively wet etched using HF and $HNO_3$ in a ratio of 30%:70%, respectively. In one embodiment, the pillars 501 including tungsten (W), titanium (Ti), or both titanium and tungsten are selectively wet etched using $NH_4OH$ and $H_2O_2$ in a ratio of 1:2, respectively. In one embodiment, the pillars 501 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 501 are selectively wet etched using diluted or concentrated one or more of the chemistries including hydrochloric acid (HCl), nitric acid ($HNO_3$), sulfuric acid ($H_2SO_4$), hydrogen fluoride (HF), and hydrogen peroxide ($H_2O_2$). In one or more embodiments, the pillars 501 are selectively etched using a solution of HF and $HNO_3$, a solution of $NH_4OH$ and $H_2O_2$, $WCl_5$, $WF_6$, niobium fluoride ($NbF_5$), chlorine with a hydrocarbon. In one or more embodiments, the hydrocarbon can be a monocarbon (e.g. $CH_4$) or multicarbon-based hydrocarbon. In one embodiment, the pillars 501 are selectively wet etched using HF, $HNO_3$, and acetic acid ($CH_3COOH$) in a ratio of 4:4:3, respectively. In one embodiment, the pillars 501 are selectively dry etched using a bromotrifluoromethane ($CBrF_3$) reactive ion etching (RIE) technique. In one embodiment, the pillars 501 are selectively dry etched using chlorine-, fluorine-, bromine-, or any combination thereof, based chemistries. In one embodiment, the pillars 501 are selectively wet etched using hot or warm Aqua Regia mixture including HCl and $HNO_3$ in a ratio of 3:1, respectively. In one embodiment, the pillars 501 are selectively etched using alkali with oxidizers (potassium nitrate ($KNO_3$) and lead dioxide ($PbO_2$)).

FIGS. 7A-7B show views of an embodiment in which at least one of the pillars 501 is removed and at least one of the pillars 501 remains. The skilled artisan will recognize that selective removal of some of the pillars can be effected by any suitable technique including, but not limited to, masking and lithography.

Figure 8A:
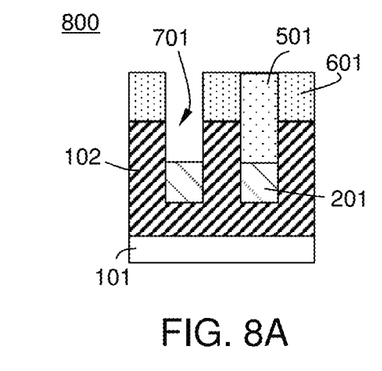
FIG. 8A is a view similar to FIG. 7A after the liner has been removed according to one embodiment.
Figure 8B:
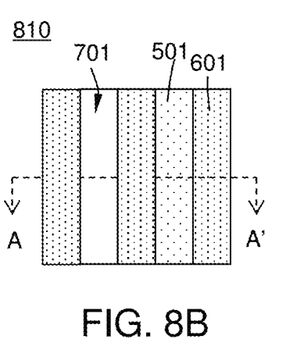
FIG. 8B illustrates a top view of the electronic device structure depicted in FIG. 8A.

FIG. 8A is a view 800 that is similar to FIG. 7A after liner 301 has been removed. FIG. 8B is a top view 810 of the electronic device depicted in FIG. 8A.

In one or more embodiment, the removal of liner 301 is selective, and recessed conductive lines 201 are not affected. Without intending to be bound by theory, it is thought that the wet etch process of one or more embodiment to remove liner 301 using a base and hydrogen peroxide is selective to copper. As recognized by one of skill in the art, it is not trivial to remove Ta, TaN, and copper separately. Once Ta, TaN, and copper are present together, as in the liner 301 and recessed conductive lines 201 of one or more embodiment, selective etch of Ta and TaN is extremely difficult, and the copper will also etch/be removed at the same time.

Referring to FIGS. 8A-8B, in one or more embodiment, liner 301 is removed from the recessed conductive lines 201 using one or more of a base or hydrogen peroxide. In one or more embodiment, a base is used in a concentration range of about 0.1 N to about 20 N. In one or more embodiment, both the base and hydrogen peroxide are used to remove liner 301. When both a base and hydrogen peroxide are used to remove the liner 301, they may be used in a ratio of base to hydrogen peroxide of about 1:2 to about 5:1, including a ratio of base to hydrogen peroxide of about 1:1. Without intending to be bound by theory, it is thought that by keeping the amount of hydrogen peroxide low, the damage to the insulating layer (e.g. ultra-low k) is minimized. In one or more embodiment, removal of the liner 301 occurs at a temperature in the range of about 25° C. to about 90° C., including a range of about 30° C. to about 85° C., about 35° C. to about 80° C., about 25° C. to about 85° C., about 25° C. to about 75° C., about 25° C. to about 70° C., about 25° C. to about 65° C., about 25° C. to about 65° C., about 25° C. to about 60° C., and about 40° C. to about 90° C. In one or more embodiments, removal of the liner 301 occurs at a temperature in the range of about 25° C. to about 400° C.

In one or more embodiments, the removal of the liner 301 requires heating the base (e.g. sodium hydroxide) to a temperature in the range of about 25° C. to about 90° C., then adding hydrogen peroxide. In one or more embodiments, the base may be selected from one or more of sodium hydroxide, potassium hydroxide, aluminum hydroxide, lithium hydroxide, rubidium hydroxide, cesium hydroxide, ammonium hydroxide, pyridine, trimethylamine (TMA), trimethylamine (TEA), tetramethylammonium hydroxide (TMAH), or the like. The hydrogen peroxide is added just before the substrate is dipped into the solution. The ratio of base to hydrogen peroxide is critical. A slight variation in the ratio can lead to too much etching of the copper or only partial removal of the liner 301.

Without intending to be bound by theory, it is thought that the liner 301 comprising tantalum (Ta) or tantalum nitride (TaN) reacts upon oxidation to form $Ta_2O_5 \cdot nH_2O$, which subsequently reacts with sodium hydroxide (NaOH) to form sodium tantalite, $NaTaO_3$.

Figure 9A:
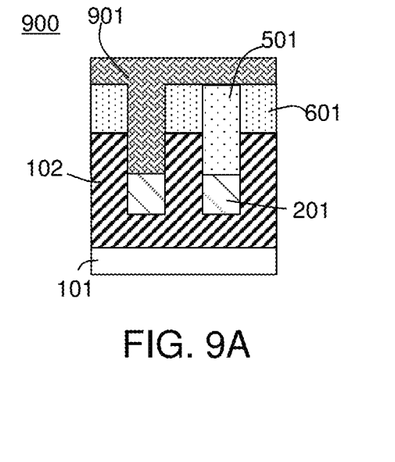
FIG. 9A is a view similar to FIG. 8A after an insulating layer is deposited according to one embodiment.
Figure 9B:
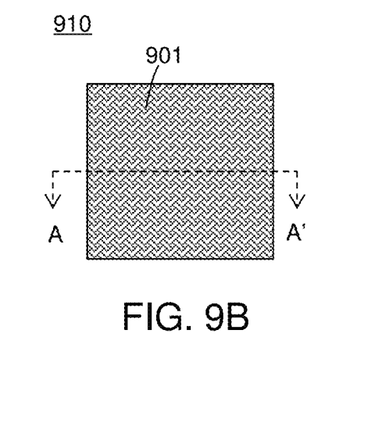
FIG. 9B illustrates a top view of the electronic device structure depicted in FIG. 9A.

FIG. 9A is a view 900 similar to FIG. 8A, and, after an insulating layer 901 is deposited to overfill and surround the pillars 501 according to one embodiment. FIG. 9B is a top view 910 of the electronic device depicted in FIG. 9A. As shown in FIGS. 9A-9B, insulating layer 901 is deposited on and around the pillars 501 on the portions of the insulating layer 601 and metallization layer with recessed conductive lines 201.

In one embodiment, insulating layer 901 is a low-k gapfill layer. In one embodiment, insulating layer 901 is a flowable silicon oxide (FSiOx) layer. In at least some embodiments, insulating layer 901 is an oxide layer, e.g., silicon dioxide ($SiO_2$), or any other electrically insulating layer determined by an electronic device design. In one embodiment, insulating layer 901 is an interlayer dielectric (ILD). In one embodiment, insulating layer 901 is a low-k dielectric that includes, but is not limited to, materials such as, e.g., silicon dioxide, silicon oxide, a carbon based material, e.g., a porous carbon film, carbon doped oxide ("CDO"), e.g. carbon doped silicon dioxide, porous silicon dioxide, porous silicon oxide carbide hydride (SiOCH), silicon nitride, or any combination thereof. In one embodiment, insulating layer 901 is a dielectric material having k-value less than 3. In more specific embodiment, insulating layer 901 is a dielectric material having k-value in an approximate range from about 2.2 to about 2.7. In one embodiment, insulating layer 901 includes a dielectric material having k-value less than 2. In one embodiment, insulating layer 901 represents one of the insulating layers described above with respect to insulating layer 102.

In one embodiment, insulating layer 901 is a low-k interlayer dielectric to isolate one metal line from other metal lines. In one embodiment, insulating layer 901 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

Figure 10A:
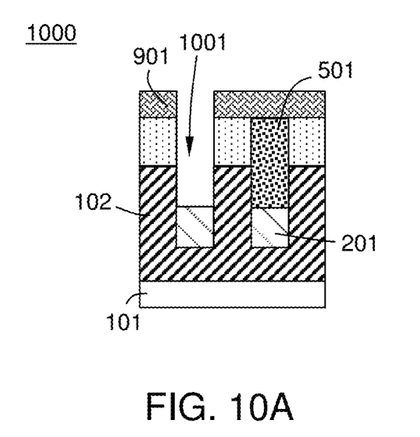
FIG. 10A is a view similar to FIG. 9A after the substrate is etched according to one embodiment.
Figure 10B:
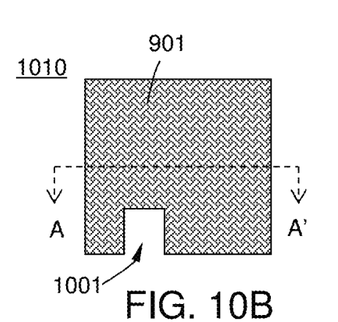
FIG. 10B illustrates a top view of the electronic device structure depicted in FIG. 10A.

FIG. 10A is a view 1000 similar to FIG. 10A after the substrate 101 is etched to form openings 1001 according to one embodiment. FIG. 10B is a top view 1010 of the electronic device depicted in FIG. 10A. As shown in FIGS. 10A-10B, insulating layer 901 is removed selectively to the insulating layer 601, insulating layer 102, and recessed conductive lines 201. As shown in FIGS. 10A-10B, openings 1001 are formed in the insulating layers 901, 601, and 102. Openings 1001 extend along the same axis as the recessed conductive lines 201. As shown in FIGS. 10A-10B, each opening 1001 has a bottom that is a top surface 203 of recessed conductive lines 201. Generally, the aspect ratio of the opening refers to the ratio of the depth of the opening to the width of the opening. In one embodiment, the aspect ratio of each opening 1001 is in an approximate range from about 1:1 to about 200:1.

In one embodiment, the insulating layer 901 is selectively removed using one or more of the dry and wet etching techniques known to one of ordinary skill in the art of electronic device manufacturing. In one embodiment, the insulating layer 901 is selectively wet etched by e.g., 5 wt. % of ammonium hydroxide ($NH_4OH$) aqueous solution at the temperature of about 80° C. In one embodiment, hydrogen peroxide ($H_2O_2$) is added to the 5 wt. % $NH_4OH$ aqueous solution to increase the etching rate of the insulating layer 901. In one embodiment, the insulating layer 901 is selectively wet etched using hydrofluoric acid (HF) and nitric acid ($HNO_3$) in a ratio of 1:1. In one embodiment, the insulating layer 901 is selectively wet etched using HF and $HNO_3$ in a ratio of 3:7 respectively. In one embodiment, the insulating layer 901 is selectively wet etched using HF and $HNO_3$ in a ratio of 4:1, respectively. In one embodiment, the insulating layer 901 is selectively wet etched using HF and $HNO_3$ in a ratio of 30%:70%, respectively.

Figure 11A:
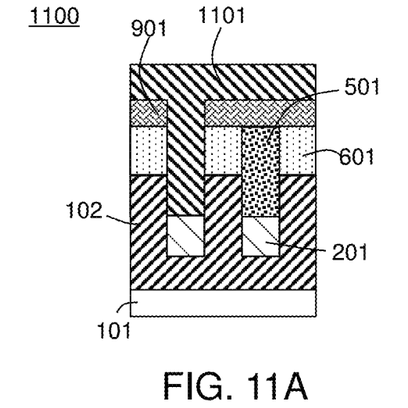
FIG. 11A is a view similar to FIG. 10A after a via has been filled according to one embodiment.
Figure 11B:
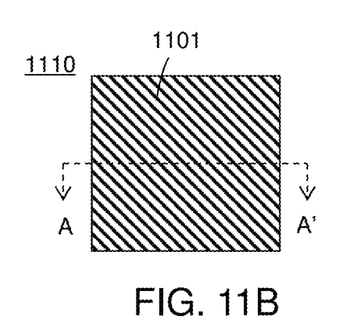
FIG. 11B illustrates a top view of the electronic device structure depicted in FIG. 11A.

FIG. 11A is a view 1100 that is similar to FIG. 10A after a metal film 1101 is deposited in the opening 1001 on recessed conductive lines 201. FIG. 11B is a top view 1110 of the electronic device depicted in FIG. 11A. Metal film 1101 comprises a set of conductive lines which extend along the first direction and aligned with the set of recessed conductive lines 201.

In one embodiment, forming the conductive lines 1101 involves filling the opening 1001 with a layer of conductive material. In one embodiment, a base layer (not shown) is first deposited on the internal sidewalls and bottom of the opening 1001 onto the recessed conductive lines 201, and then the conductive layer is deposited on the base layer. In one embodiment, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the insulating layer 102. Additionally, the conductive barrier layer can be used to provide adhesion for the seed layer (e.g., copper).

In one embodiment, to form the base layer, the conductive barrier layer is deposited onto the sidewalls and bottom of the opening 1001, and then the seed layer is deposited on the conductive barrier layer. In another embodiment, the conductive base layer includes the seed layer that is directly deposited onto the sidewalls and bottom of the opening 1001. Each of the conductive barrier layer and seed layer may be deposited using any think film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base layer of copper, by an electroplating process. In one embodiment, the conductive layer is deposited into the opening 1001 using a damascene process known to one of ordinary skill in the art of microelectronic device manufacturing. In one embodiment, the conductive layer is deposited onto the seed layer in the opening 1001 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one embodiment, the choice of a material for conductive layer for the conductive lines 1101 determines the choice of a material for the seed layer. For example, if the material for the conductive lines 1101 includes copper, the material for the seed layer also includes copper. In one embodiment, the conductive lines 1101 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

An upper metallization layer My includes a set of conductive lines in a metal film 1101 that extend on portions of insulating layer 901. As shown in FIG. 11A-11B, conductive lines in a metal film 1101 extend along Y axis 122. The fully self-aligned via filled with conductive lines in a metal film 1101 connects the lower metallization layer Mx comprising recessed conductive lines 201 that extend along X axis 121 and the upper metallization layer My comprising conductive lines in a metal film 1101. As shown in FIGS. 11A-11B, the via filled with conductive lines in a metal film 1101 is self-aligned along the Y axis 122 to recessed conductive lines 201.

In one embodiment, forming the filled via with conductive lines in a metal film 1101 involves depositing a layer of conductive material on the top surface of insulating layer 901. In one embodiment, a base layer (not shown) is first deposited on the top surface of the insulating layer 901, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper).

In one embodiment, to form the base layer, the conductive barrier layer is deposited on the insulating layer 901, and then the seed layer is deposited on the conductive barrier layer. In another embodiment, the conductive base layer includes the seed layer that is directly deposited on the insulating layer 901. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one non-limiting example, the thickness of the conductive lines in a metal film 1101 is in an approximate range from about 15 nm to about 1000 nm. In one non-limiting example, the thickness of the conductive lines in a metal film 1101 is from about 20 nm to about 200 nm. In one non-limiting example, the width of the conductive lines in a metal film 1101 is in an approximate range from about 5 nm to about 500 nm. In one non-limiting example, the spacing (pitch) between the conductive lines in a metal film 1101 is from about 2 nm to about 500 nm. In more specific non-limiting example, the spacing (pitch) between the conductive lines in a metal film 1101 is from about 5 nm to about 50 nm.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method of forming a self-aligned via, the method comprising:
    providing a substrate having a first insulating layer thereon, the first insulating layer having a top surface and a plurality of trenches formed along a first direction, the plurality of trenches having recessed first conductive lines extending along the first direction and having a first conductive surface below the top surface of the first insulating layer;
    forming a liner comprising tantalum on the recessed first conductive lines;
    forming at least one pillar on the recessed first conductive lines, the at least one pillar extending orthogonal to the top surface of the first insulating layer;
    depositing a second insulating layer around the at least one pillar and on the top surface of the first insulating layer;
    selectively removing at least one of the pillars to form at least one opening in the second insulating layer, leaving at least one pillar on the recessed first conductive lines; and
    removing the liner from the recessed first conductive lines using one or more of a base or hydrogen peroxide.

2. The method of claim 1, wherein both the base and the hydrogen peroxide are used to remove the liner.

3. The method of claim 2, wherein the base and the hydrogen peroxide are present in a ratio in a range of about 1:1 to about 5:1.

4. The method of claim 1, wherein removing the liner occurs at a temperature in a range of about 25° C. to about 90° C.

5. The method of claim 1, wherein the recessed first conductive lines comprise one or more of copper or cobalt.

6. The method of claim 2, wherein the base is selected from one or more of sodium hydroxide, potassium hydroxide, aluminum hydroxide, lithium hydroxide, rubidium hydroxide, cesium hydroxide, ammonium hydroxide, pyridine, trimethylamine (TMA), trimethylamine (TEA), or tetramethylammonium hydroxide (TMAH).

7. The method of claim 1, further comprising depositing a third insulating layer through the at least one opening onto the recessed first conductive lines.

8. The method of claim 7, further comprising etching the third insulating layer selectively relative to the second insulating layer to form at least one via opening to the recessed first conductive lines.

9. The method of claim 8, further comprising depositing a second conductive material in the at least one via opening to form a first via and second conductive lines, the first via connecting the recessed first conductive lines to the second conductive lines.

10. The method of claim 8, wherein the via opening is self-aligned along the first direction and a second direction to one of the recessed first conductive lines, the second direction crossing the first direction at an angle.

11. The method of claim 1, wherein the recessed first conductive lines comprise copper.

12. The method of claim 1, wherein forming the at least one pillar comprises forming a metal film on the recessed first conductive lines and growing the at least one pillar from the metal film.

13. The method of claim 12, wherein growing the metal film into at least one pillar comprises one or more of oxidation or nitridation of the metal film.

14. The method of claim 1, wherein selectively removing at least one pillar comprises forming a hard mask on the second insulating layer, the hard mask having an opening over the at least one pillar; and removing the at least one pillar to form the at least one opening.

15. The method of claim 1, wherein the at least one pillar comprises tungsten oxide.

16. The method of claim 7, wherein the first insulating layer, the second insulating layer and the third insulating layer are independently selected from the group consisting of oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof.

17. The method of claim 9, wherein the second conductive material comprises one or more of copper or cobalt.

18. The method of claim 1, wherein depositing the second insulating layer comprises depositing a second insulating material on the first insulating layer, around and on a top of the at least one pillar to form an overburden of the second insulating layer; and planarizing the second insulating layer to remove the overburden of the second insulating layer and expose the top of the at least one pillar.

19. The method of claim 1, wherein the at least one pillar is removed by etching with a solution of HF and $HNO_3$, a solution of $NH_4OH$ and $H_2O_2$, $WCl_5$, $WF_6$, niobium fluoride, chlorine with a hydrocarbon.

20. A method of forming a self-aligned via, the method comprising:
providing a substrate having a first insulating layer thereon, the first insulating layer having a top surface and a plurality of trenches formed along a first direction, the plurality of trenches having recessed first conductive lines extending along the first direction and having a first conductive surface below the top surface of the first insulating layer, the first insulating layer comprising ultra low-k and the recessed first conductive lines comprising copper or cobalt;
forming a liner comprising tantalum on the recessed first conductive lines;
forming a metal film comprising tungsten on the recessed first conductive lines and growing at least one pillar comprising tungsten oxide from the metal film on the recessed first conductive lines, the at least one pillar extending orthogonal to the top surface of the first insulating layer;
depositing a second insulating layer on the first insulating layer, around the at least one pillar and on a top of the at least one pillar to form an overburden of the second insulating layer;
planarizing the second insulating layer to remove the overburden of the second insulating layer and expose the top of the at least one pillar;
selectively removing at least one of the pillars to form at least one opening in the second insulating layer, leaving at least one pillar on the recessed first conductive lines;
removing the liner from the recessed first conductive lines using a base and hydrogen peroxide in a ratio of about 1:1 to about 5:1, wherein the base is selected from one or more of sodium hydroxide, potassium hydroxide, aluminum hydroxide, lithium hydroxide, rubidium hydroxide, cesium hydroxide, ammonium hydroxide, pyridine, trimethylamine (TMA), trimethylamine (TEA), or tetramethylammonium hydroxide (TMAH);
depositing a third insulating layer through the at least one opening onto the recessed first conductive lines;
etching the third insulating layer selectively relative to the second insulating layer to form at least one via opening to the recessed first conductive lines; and
depositing a second conductive material in the at least one opening to form a via and second conductive lines, the first via connecting the recessed first conductive lines to the second conductive lines.

* * * * *